United States Patent

Zhang et al.

[11] Patent Number: 5,999,047
[45] Date of Patent: Dec. 7, 1999

[54] LINEARIZER FOR USE WITH RF POWER AMPLIFIERS

[75] Inventors: Weimin Zhang, Mountain View; Mark Adams, Santa Clara; Cindy Yuen, Saratoga, all of Calif.

[73] Assignee: Space Systems/Loral, Inc., Palo Alto, Calif.

[21] Appl. No.: 09/127,357

[22] Filed: Jul. 31, 1998

Related U.S. Application Data

[63] Continuation-in-part of application No. 08/755,952, Nov. 25, 1996, Pat. No. 5,789,978.

[51] Int. Cl.$^6$ .............................. H03F 1/26; H03G 3/10; H03G 3/20
[52] U.S. Cl. ......................... 330/149; 330/284; 330/129
[58] Field of Search ............................. 330/53, 149, 129, 330/284

[56] References Cited

U.S. PATENT DOCUMENTS

| | | | |
|---|---|---|---|
| 5,015,965 | 5/1991 | Katz et al. | 330/149 |
| 5,291,148 | 3/1994 | Reisner et al. | 330/149 |

*Primary Examiner*—Robert Pascal
*Assistant Examiner*—Patricia T. Nguyen
*Attorney, Agent, or Firm*—Kenneth W. Float

[57] ABSTRACT

A pre-distortion type linearizer circuit for use in linearizing the performance of power amplifiers such as traveling wave tube and solid state power amplifiers. The linearizer circuit comprises linearizer bridge that includes a phase shifter and a fixed delay in a linear arm, and a distortion generator and an attenuator in a nonlinear arm. The output of the linearizer bridge is coupled through an output amplifier and an output attenuator. The RF output signal from the linearizer circuit is coupled to the power amplifier. A control circuit receives on and off input command signals, and outputs a bilevel telemetry signal that is used as a mode indicator for ground command control. The control circuit adjusts settings of the linearizer bridge, and adjusts gain and attenuation settings of the output amplifier and output attenuator. All circuits of the linearizer circuit may be integrated onto a single alumina substrate, for example. The linearizer bridge circuit may be used with traveling wave tube amplifiers and solid state power amplifiers operating in the S, C, X, Ku, K, Ka, Q, V, or W frequency bands, or any other desired RF frequency band.

16 Claims, 3 Drawing Sheets

LINEARIZER FOR USE WITH RF POWER AMPLIFIERS

CROSS-REFERENCE TO RELATED APPLICATIONS

This application is a continuation in part of U.S. patent application Ser. No. Ser. No. 08/755,952, filed Nov. 25, 1996, now U.S. Pat. No. 5,789,978.

BACKGROUND

The present invention relates generally to power amplifiers, and more particularly, to a linearizer circuit for use with power amplifiers such as traveling wave tube and solid state power amplifiers.

Nippon Electric Corporation (NEC) has developed a linearizer circuit that uses an amplifier as a distortion generator. The NEC linearizer is rated at 4 watts, and weighs 650 grams. ANT Bosch Telecom has developed a linearizer bridge circuit. This system has dimensions of 2.6 centimeters by 1.6 centimeters. Four substrates are required to produce the ANT Bosch Telecom linearizer bridge circuit, and it cannot be used to adjust the power transfer curve of a traveling wave tube amplifier. The ANT Bosch Telecom linearizer bridge circuit has an architecture that is similar to the present invention, but is constructed using different components that provide lower performance than the present invention and that operate at higher power levels.

Accordingly, it is an objective of the present invention to provide for an improved linearizer bridge circuit for use with a power amplifier. It is also an objective of the present invention to provide for a high performance linearizer circuit that operates at reduced power levels compared to conventional circuits.

SUMMARY OF THE INVENTION

To meet the above and other objectives, the present invention provides for a compact size, low cost, pre-distortion type linearizer circuit. The purpose of the linearizer circuit is to improve the linearity performance of a traveling wave tube amplifier or solid state power amplifier with which it is used.

The linearizer bridge circuit is comprised of linear and nonlinear arms or processing paths. In an exemplary embodiment of the linearizer bridge circuit, the linear arm comprises a phase shifter and a fixed delay, and the nonlinear arm comprises a distortion generator, such as a Schottky diode distortion generator and an attenuator. A control circuit is used to set various bias settings for circuits of the linearizer bridge circuit. All circuits may be integrated on a single substrate, which may preferably by comprised of alumina. Compact size, lower parts count, reduced assembly and RF tuning and test labor costs are realized with the present linearizer bridge circuit.

By applying a DC bias to Schottky diodes in the distortion generator, for example, the operational power level of the present linearizer bridge circuit is much lower than a conventional linearizer bridge. The major advantage of this feature is that there is less heat dissipation in the circuit and less DC power is required for operation. In addition, lower operational power levels lead to better c/3IM performance in bypass mode.

Another important feature of the present invention is that, by changing the bias applied to the distortion generator, the phase shifter and the attenuator, instead of making the conventional phase shifter and attenuator adjustments, the present linearizer bridge circuit is capable of adjusting not only phase advance (or phase lag) and gain expansion, but also gain curvature. This feature leads to the better match between the present linearizer bridge circuit and various traveling wave tube or solid state power amplifiers with which it is employed.

A reduced to practice embodiment of the linearizer bridge circuit is integrated, in that it is much more compact in size (1.4×1.0 centimeters) and has lower power consumption 80 mW) than comparable competing designs. The linearizer bridge circuit also has a relatively wide bandwidth (approximately 3 GHz at Ku band). The reduced to practice embodiment of the linearizer bridge circuit provides both active and bypass functions. Its power transfer curve may be adjusted for use with different traveling wave tube or solid state power amplifiers.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which.

DETAILED DESCRIPTION

Figure 1:
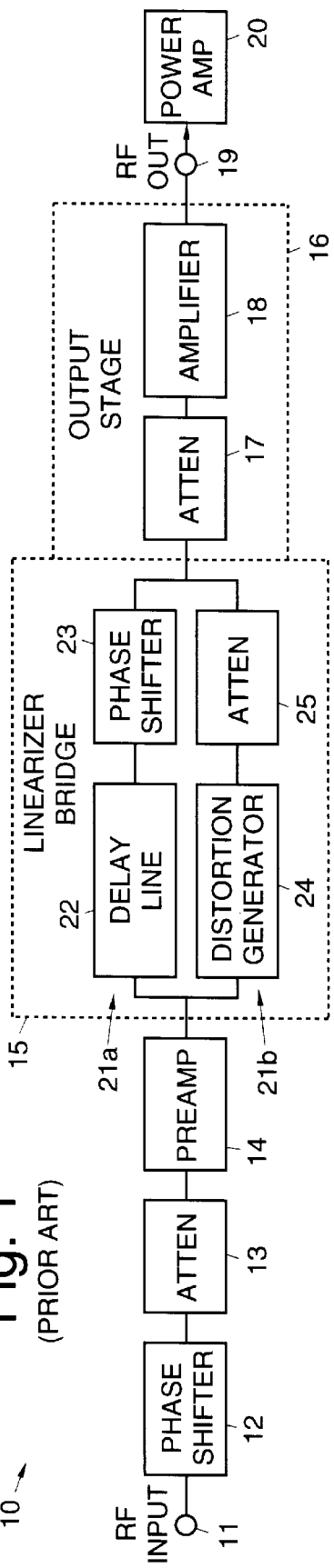
FIG. 1 illustrates a conventional linearizer circuit.

Referring to the drawing figures, FIG. 1 illustrates a conventional linearizer circuit 10 that may be used with a traveling wave tube amplifier (TWTA) 20 or solid state power amplifier (SSPA) 20. The linearizer circuit 10 depicted in FIG. 1 is representative of one manufactured by ANT Bosch Telecom.

The conventional linearizer bridge circuit 10 has an RF input 11 for receiving an RF input signal that is coupled by way of an input phase shifter 12 and an input variable attenuator 13 to a preamplifier 14. The output of the preamplifier 14 is coupled to a linearizer bridge 15. The output of the linearizer bridge 15 is coupled to an output stage 16 that includes an attenuator 17 and an amplifier 18. The output stage 16 has an RF output 19 for providing an RF output signal from the linearizer circuit 10 that is coupled to the traveling wave tube amplifier 20 or solid state power amplifier 20.

The conventional linearizer bridge 15 has separate RF paths 21a, 21b comprising linear and nonlinear arms 21a, 21b, respectively. The linear arm 21a includes a fixed delay line 22 and a phase shifter 23. The nonlinear arm 21b includes a distortion generator circuit 24 and a PIN diode attenuator 25. The PIN diode attenuator 25 is controlled by a resistive circuit containing a thermistor (not shown). The resistor values are optimized to vary the attenuation of the attenuator 25 over the operating temperature range in order to compensate for the gain variation of the linearizer circuit 10 and traveling wave tube amplifier 20 or solid state power amplifier 20.

Figure 2:
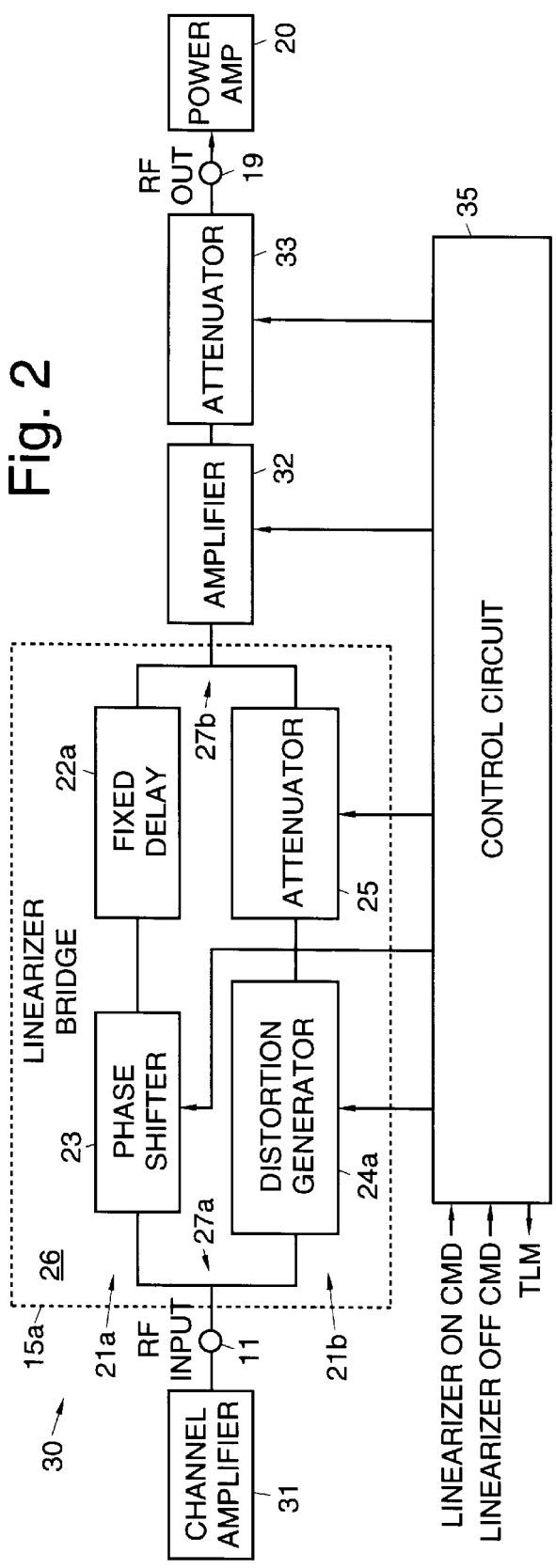
FIG. 2 illustrates an exemplary embodiment of a linearizer circuit in accordance with the principles of the present invention.

Referring now to FIG. 2, it shows an RF block diagram of an exemplary embodiment of an improved linearizer circuit 30 in accordance with the principles of the present invention. The linearizer circuit 30 is designed for use with the traveling wave tube amplifier 20 or solid state power amplifier 20. The linearizer circuit 30 is used as an interface between a channel amplifier 31 and the traveling wave tube amplifier 20 or solid state power amplifier 20. The channel amplifier 31 provides an amplified RF input signal to the linearizer circuit 30. The linearizer circuit 30 comprises a linearizer bridge 15a that has an RF input 11 for receiving the amplified RF input signal from the channel amplifier 31. The output of the linearizer bridge 15a is couple by way of an adjustable gain circuit 34 to an RF output 19. The adjustable gain circuit 34 typically comprises an output amplifier 32 and an output attenuator 33. The RF output 19 couples an RF output signal from the linearizer circuit 30 to the traveling wave tube amplifier 20 or solid state power amplifier 20.

The linearizer bridge 15a is a balanced bridge circuit having separate RF paths 21a, 21b comprising linear and nonlinear arms 21a, 21b, or processing paths 21a, 21b respectively. The linear arm 21a comprises a fixed delay line 22a and a phase shifter 23, such as one disclosed in U.S. Pat. No. 5,317,288 assigned to the assignee of the present invention. The phase shifter 23 disclosed in U.S. Pat. No. 5,317,288 uses PIN diodes (not shown) and has a wide, 360 degree, phase shift range. The nonlinear arm 21b comprises a nonlinear distortion generator circuit 24a and an attenuator 25.

The nonlinear distortion generator circuit 24a preferably uses Schottky diodes, for example, and the attenuator 25 may preferably be a PIN diode attenuator 25. Alternatively, the distortion generator circuit 24a may be made using metal-semiconductor-metal (MEM) diodes, for example. The attenuator 25 may alternatively be made using field effect transistor (FET) diodes, for example. Input and output hybrid couplers 27a, 27b may be used to couple the RF signal to and from the linear and nonlinear arms 21a, 21b of the linearizer bridge 15a. All of the circuits of the linearizer bridge 15a are preferably fabricated on a single substrate 26, which may preferably by comprised of alumina.

In general, the function of the linear arm 21a is to provide a linear signal path with adjustable phase. This function may be achieved using phase shifters 23, or any device that produces this desired function, and whose bias level is controllable. The phase shifters 23 may use varactor diodes for example.

The function of the nonlinear arm 21b is to provide a nonlinear signal path with adjustable gain. This function may be achieved using nonlinear diodes, or amplifiers, or any device that produces this desired function, and whose gain and attenuation settings are adjustable by means of a controller.

A control circuit 35 is coupled to the phase shifter 23, nonlinear distortion generator circuit 24a, and the attenuator 25. The control circuit 35 has inputs for receiving on and off input command signals, and an output for generating a bilevel telemetry (TLM) signal. The control circuit 35 is used to adjust the settings of the distortion generator 24a, the phase shifter 23, the attenuator 25, and the gain and attenuation settings of the output amplifier 32 and output attenuator 33. The bilevel telemetry (TLM) signal is used as a mode indicator for ground command control.

Figure 3:
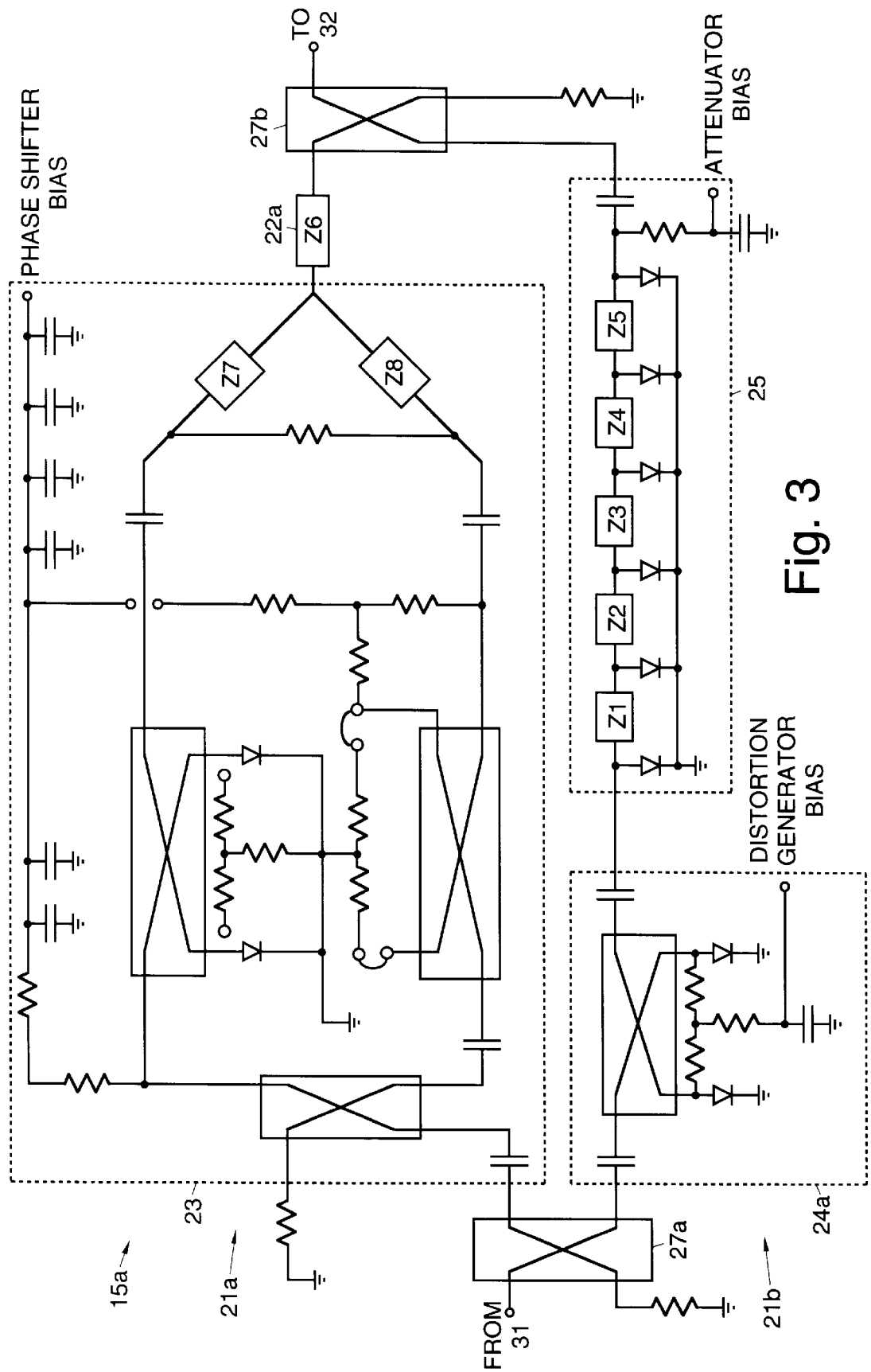
FIG. 3 is a detailed schematic diagram of the exemplary embodiment of the linearizer circuit of FIG. 2.

Referring to FIG. 3, it shows a detailed schematic diagram of the exemplary linearizer circuit 30 of FIG. 2. A preferred embodiment of the fixed delay line 22 comprises a bent 50 ohm line, which is employed to compensate the delay between the linear and nonlinear arms 21a, 21b, reduce dispersion and improve the operating frequency band. A preferred embodiment of the phase shifter 23 comprises two pairs of PIN diode reflection attenuators. This circuit provides 360° phase shifting with constant insertion loss. Details of the construction of the phase shifter 23 may be found in U.S. Pat. No. 5,317,288, the contents of which are incorporated herein by reference. A preferred embodiment of the nonlinear distortion generator circuit 24a comprises a Lange coupler and two diodes to form a balanced reflection circuit. With properly applying DC bias, this circuit works at low power levels (c-3 dBm) as well as higher power levels. In addition, the gain curve can be easily manipulated by selection of the DC bias level applied to the distortion generator circuit 24a. A preferred embodiment of the attenuator 25 comprises six diodes and is used to adjust the output power of the nonlinear arm 21b. In bypass mode, the preferred embodiment of the attenuator 25 provides greater than 35 dB attenuation, which makes the linearizer circuit 30 a linear circuit.

The linearizer circuit 30 operates as follows. The linearizer bridge 15a has two operational modes; active mode and bypass mode. In the active mode, the linearizer bridge 15a functions as a nonlinear circuit that provides up to 10 dB gain expansion with up to 90° phase advance. The gain expansion value and phase advance value are controlled by the phase shifter 23 and attenuator 25. In addition, the gain curve can be adjusted by changing the bias supplied to the distortion generator 24a. In the bypass mode, the attenuator 25 provides high attenuation in the nonlinear arm 21b. Therefore, the lineaizer bridge 15a functions as a linear circuit.

Figure 4:
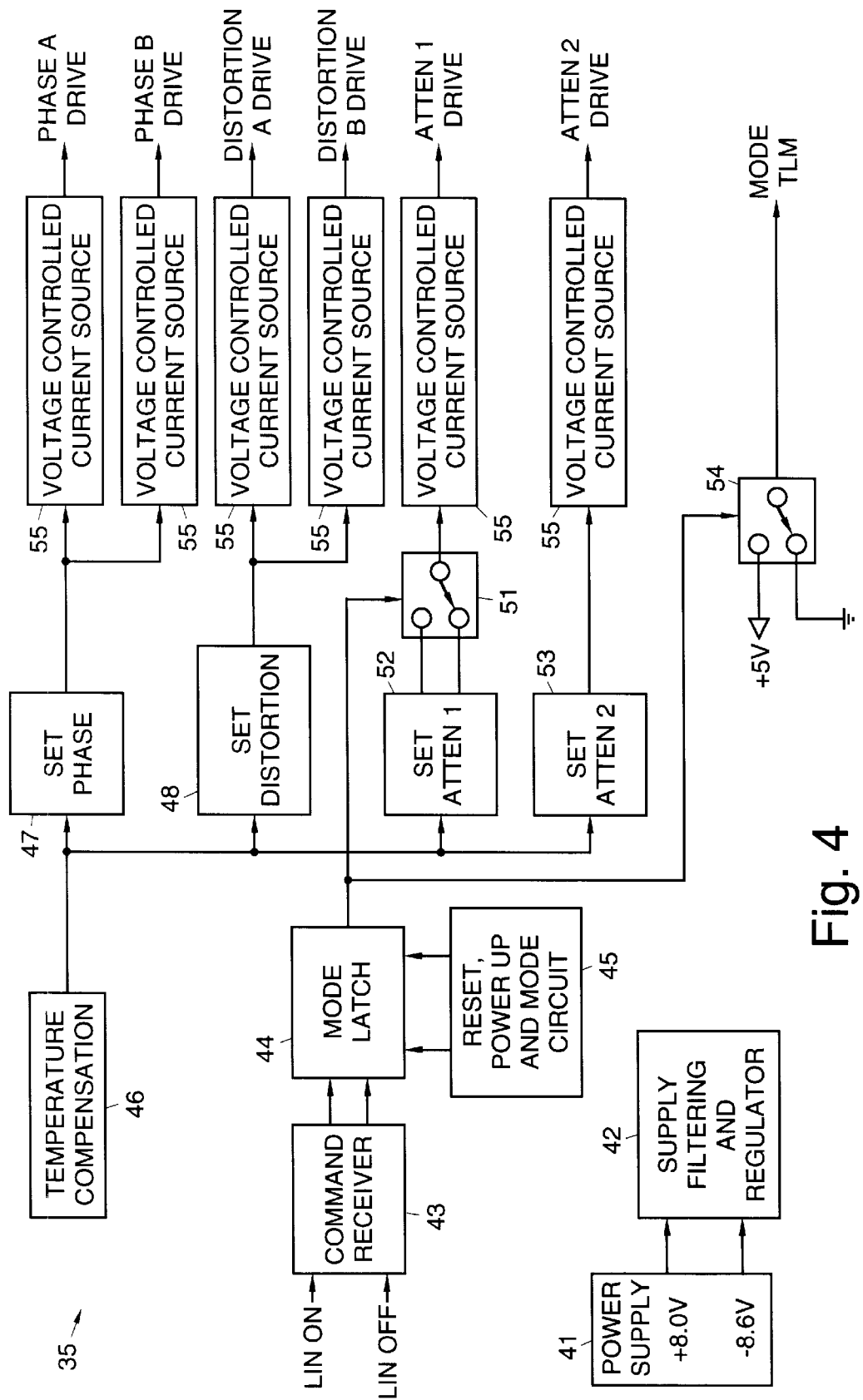
FIG. 4 is a block diagram of a control circuit employed in the exemplary embodiment of the linearizer circuit of FIG. 2.

Referring to FIG. 4, it a block diagram of an exemplary control circuit 35 employed in the linearizer circuit 30 of FIG. 2. The control circuit 35 comprises a power supply 41 having 8.0 and 8.6 volt outputs that are filtered and regulated by a supply filtering and regulator circuit 42. The linearizer circuit 30 is turned on and off by on and off signals (LIN ON, LIN OFF) input to a command receiver 43 which commands are coupled to a mode latch 44 for the active and bypass modes of the linearizer circuit 30. A reset, power up and mode control circuit 45 is coupled to the mode latch 44 that controls these functions.

A temperature compensation circuit 46 is coupled to a set phase circuit 47, a set distortion circuit 48, a set attenuation 1 circuit 51, and a set attenuation 2 circuit 52. Based upon the output of the temperature compensation circuit 46 the set phase circuit 47, set distortion circuit 48, set attenuation 1 circuit 51, and set attenuation 2 circuit 52 drive voltage controlled current sources 55 coupled thereto. Two voltage controlled current sources 55 provide phase A and phase B drive signals to the phase shifter 23. Two voltage controlled current sources 55 provide distortion A and distortion B drive signals to the Schottky diode distortion generator 24a.

The set attenuation 1 circuit 52 outputs two attenuation values to a first switch 51 which is controlled by the mode latch 44 to selectively drive a voltage controlled current source 55 that provides a first attenuator drive signal (ATTEN 1 DRIVE) that is supplied to the attenuator 25. The set attenuation 2 circuit 53 outputs an attenuation value to drive a voltage controlled current source 55 that provides a second attenuator drive signal (ATTEN 2 DRIVE) that is supplied to the output attenuator 33. The output of the mode latch 44 is also coupled to a second switch 54 that selects between a +5 volt and ground signal that generates the mode bilevel telemetry (MODE TLM) signal.

The control circuit 35 provides DC bias for the distortion generator 24a, the attenuator 25, and the phase shifter 23 to control the phase advance and gain expansion values. The control circuit 35 also provides DC bias for the output amplifier 32 and output attenuator 33 to control the gain levels thereof. A temperature compensation circuit is employed in the control circuit 35 to control the temperature of the distortion generator 24a, attenuators 25, 33 and phase shifter 23 to provide constant performance over a wide temperature range. The control circuit 35 switches the linearizer bridge 15a between active and bypass modes, and provides the bilevel telemetry signal as a mode indicator for ground command control.

By properly adjusting the settings of the distortion generator 24a, the phase shifter 23, and the attenuator 25, desired gain expansion and phase advance with respect to the power level of the RF input signal applied to the linearizer bridge circuit 30 is achieved. This cancels the gain compression and phase lag generated by the traveling wave tube amplifier 20 and therefore improves its linearity performance (third-order intermodulation, phase, and AM/PM conversion).

The linearizer circuit 30 operates in active and bypass modes. In bypass mode, the attenuation of the nonlinear arm 21b is increased to greater than 30 dB, forcing the RF input signal to only pass through the linear arm 21a. Therefore, the linearizer circuit 15 provides both active and bypass mode functions.

An integrated Ku-band linearizer circuit 30 has been reduced to practice and is used with a traveling wave tube amplifier 20 or solid state power amplifier 20. The phase shifter 23, distortion generator 24a implemented as a Schottky diode distortion generator 24a, attenuator 25, and delay line 22 are fabricated on a single alumina substrate 26. The Ku-band linearizer circuit 30 that was reduced to practice has the advantages of compact size, a relatively small number of circuits, and may be manufactured with reduced assembly and RF tuning and setting labor compared to a currently used multi-carrier amplifier design.

While the present invention has been described with reference to an exemplary Ku-band linearizer bridge circuit 30, it is to be understood that the present invention is not band-limited. In particular, the concepts of the present invention and its architecture may be used to produce a linearizer bridge circuit 30 that operates in the S, C, X, Ku, K, Ka, Q, V, or W frequency bands, for example, or any other desired RF frequency band. Consequently, the present invention is not limited to any particular operating frequency band.

Thus, an improved linearizer circuit for use with power amplifiers has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A linearizer circuit for use with a power amplifier, comprising:

a linearizer bridge comprising a linear processing path comprising a fixed delay line and a phase shifter, and a nonlinear processing path comprising a nonlinear distortion generator and an attenuator, for processing an RF input signal to produce an RF output signal;

an adjustable gain circuit for adjusting the gain of the RF output signal; and a control circuit for controlling the distortion generator, the phase shifter and the attenuator to produce a desired gain expansion and phase advance or lag with respect to the power level of the RF input signal, which cancels the gain compression and phase lag or advance generated by the power amplifier.

2. The linearizer circuit of claim 1 wherein the control circuit changes the bias applied to the distortion generator, the phase shifter and the attenuator.

3. The linearizer circuit of claim 1 wherein the adjustable gain circuit comprises an output amplifier and an output attenuator, and wherein the control circuit further adjusts gain and attenuation settings of the output amplifier and the output attenuator, respectively.

4. The linearizer circuit of claim 1 wherein the linear path comprises a fixed delay line and a phase shifter.

5. The linearizer circuit of claim 4 wherein the phase shifter comprises a PIN diode phase shifter.

6. The linearizer circuit of claim 1 wherein the a nonlinear path comprises a nonlinear distortion generator and an attenuator.

7. The linearizer circuit of claim 6 wherein the nonlinear distortion generator comprises a nonlinear Schottky diode distortion generator circuit and the attenuator comprises a PIN diode attenuator.

8. The linearizer circuit of claim 1 further comprising an input coupler for coupling the RF input signal to linear and nonlinear paths; and an output coupler for combining the RF signals from the linear and nonlinear paths to provide an RF output signal from linearizer bridge.

9. The linearizer circuit of claim 1 wherein the linearizer circuit operates in active and bypass modes.

10. The linearizer circuit of claim 9 wherein, when the linearizer circuit operates in bypass mode, the attenuation of the nonlinear path is increased to greater than 35 dB, forcing the RF input signal to only pass through the linear path.

11. The linearizer circuit of claim 1 wherein the control circuit provides commands to switch between active mode and bypass mode, to control temperature compensation and adjust gain curves of the linearizer bridge.

12. The linearizer circuit of claim 1 wherein the linearizer bridge is fabricated on a single substrate.

13. The linearizer circuit of claim 12 wherein the substrate comprises an alumina substrate.

14. The linearizer circuit of claim 1 wherein the control circuit processes on and off input command signals that turn the linearizer bridge circuit on and off.

15. The linearizer circuit of claim 1 wherein the control circuit outputs a bilevel telemetry signal that provides a mode indicator for ground command control.

16. The linearizer circuit of claim 1 wherein the adjustable gain circuit comprises an output amplifier for amplifying the RF output signal and an output attenuator attenuating the RF output signal.

* * * * *